US008614895B2

(12) United States Patent
Gong et al.

(10) Patent No.: US 8,614,895 B2
(45) Date of Patent: Dec. 24, 2013

(54) ELECTRONIC DEVICE HAVING EASILY ASSEMBLING STRUCTURE (75) Inventors: Xin-Hu Gong, Shenzhen (CN); Si-Wen Shu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 248 days.

(21) Appl. No.: 13/211,299

(22) Filed: Aug. 16, 2011

(65) Prior Publication Data

US 2012/0162956 A1 Jun. 28, 2012

(30) Foreign Application Priority Data

Dec. 25, 2010 (CN) .......................... 2010 1 0605352

(51) Int. Cl.
*H05K 5/00* (2006.01)
(52) U.S. Cl.
USPC ...................................... 361/730; 361/679.01
(58) Field of Classification Search
USPC ................ 361/754, 600, 679.01, 679.58, 361/726–730, 752, 807, 810; 439/152, 153, 439/157, 159, 160
See application file for complete search history.

(56) References Cited

U.S. PATENT DOCUMENTS

| | | | |
|---|---|---|---|
| 5,325,263 A * | 6/1994 | Singer et al. ............. | 361/679.39 |
| 5,790,373 A * | 8/1998 | Kim et al. ................ | 361/679.31 |
| 6,699,128 B1 * | 3/2004 | Beadell et al. ................. | 463/46 |
| 7,023,704 B1 * | 4/2006 | Zarnowitz et al. ............ | 361/754 |
| 8,218,315 B2 * | 7/2012 | Lu ............................. | 361/679.58 |
| 8,435,057 B1 * | 5/2013 | Jun et al. ....................... | 439/157 |
| 2003/0011977 A1 * | 1/2003 | Song et al. .................... | 361/684 |
| 2009/0230279 A1 * | 9/2009 | Stango .......................... | 248/682 |
| 2011/0182006 A1 * | 7/2011 | Liao .......................... | 361/679.01 |
| 2012/0182671 A1 * | 7/2012 | Hou ........................... | 361/679.01 |

* cited by examiner

*Primary Examiner* — Bernard Rojas
(74) *Attorney, Agent, or Firm* — Altis Law Group, Inc.

(57) ABSTRACT

An electronic device includes a housing and a mounting apparatus. The mounting apparatus is received in the housing. The mounting apparatus includes a casing and an operating assembly. The casing includes a front wall defining a slot. The operating assembly is received in the casing, and includes a handle, an elastic member, and an operating plate. The handle is pivotably connected to the casing. A portion of the handle can extend out of the casing through the slot by rotating the handle. The elastic member provides an elastic force to rotate the handle to make the portion of the handle extend out of the casing. The operating plate is slidably connected to the front wall, and can cover the slot to limit the portion of the handle from extending out of the casing and uncover the slot to allow the portion of the handle from extending out of the casing.

18 Claims, 8 Drawing Sheets

ELECTRONIC DEVICE HAVING EASILY ASSEMBLING STRUCTURE

BACKGROUND

1. Technical Field

The present disclosure relates to electronic devices and, particularly, to an electronic device which has a mounting apparatus for an accessory.

2. Description of Related Art

Today, electronic devices, such as servers, workstations, and computers, usually have many accessories, such as storage modules etc. In order to conveniently assemble or disassemble these accessories, the mounting apparatuses of these accessories usually have handles fixed out side of the mounting apparatuses. However, with the development of minimization of the electronic device, the space in the electronic device for receiving the handle becomes smaller and smaller, even there is no space for receiving the handle. As a result, the accessories are usually difficult to be assembled or disassembled.

What is needed is an electronic device which can ameliorate the above-mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the present disclosure will now be described in detail below, with reference to the accompanying drawing.

Figure 1:
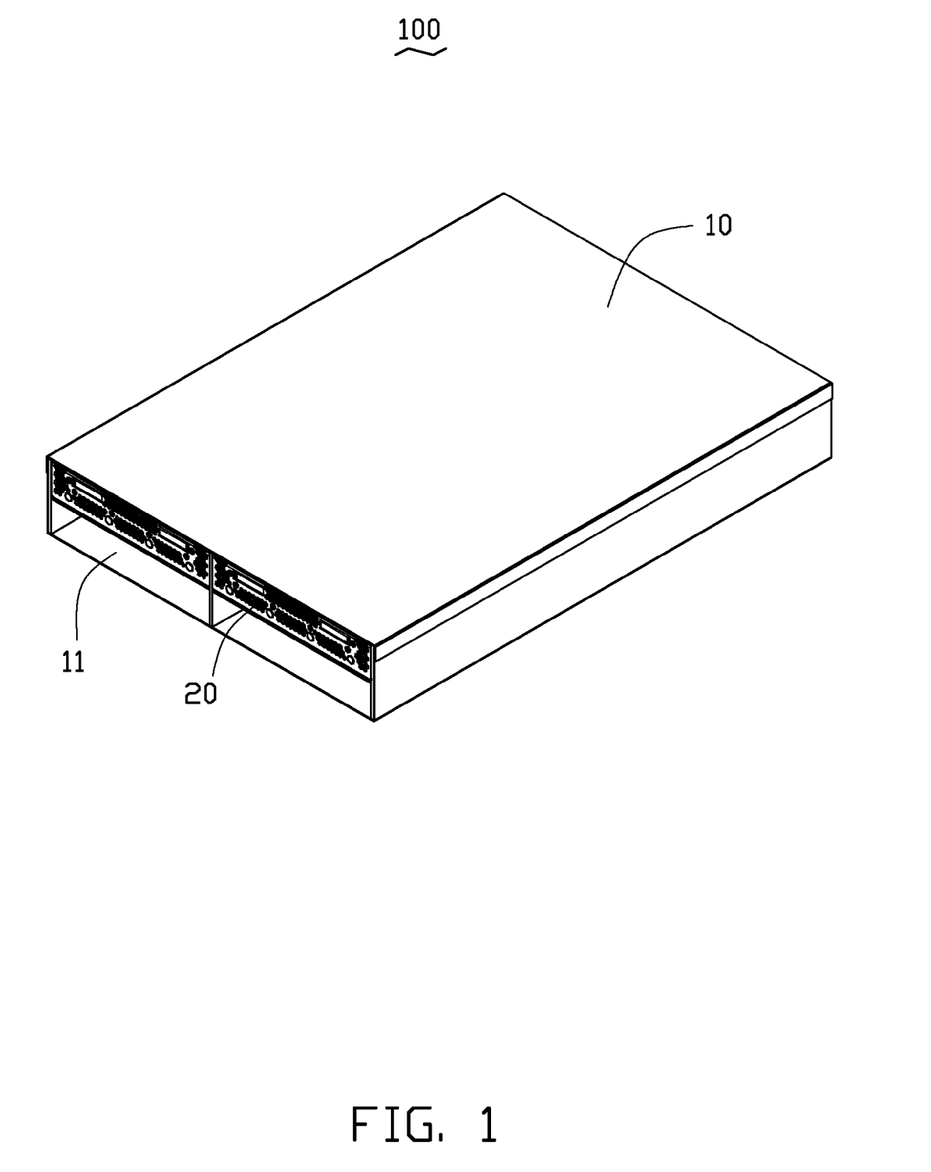
FIG. 1 is a schematic view of an electronic device according to an exemplary embodiment.
Figure 2:
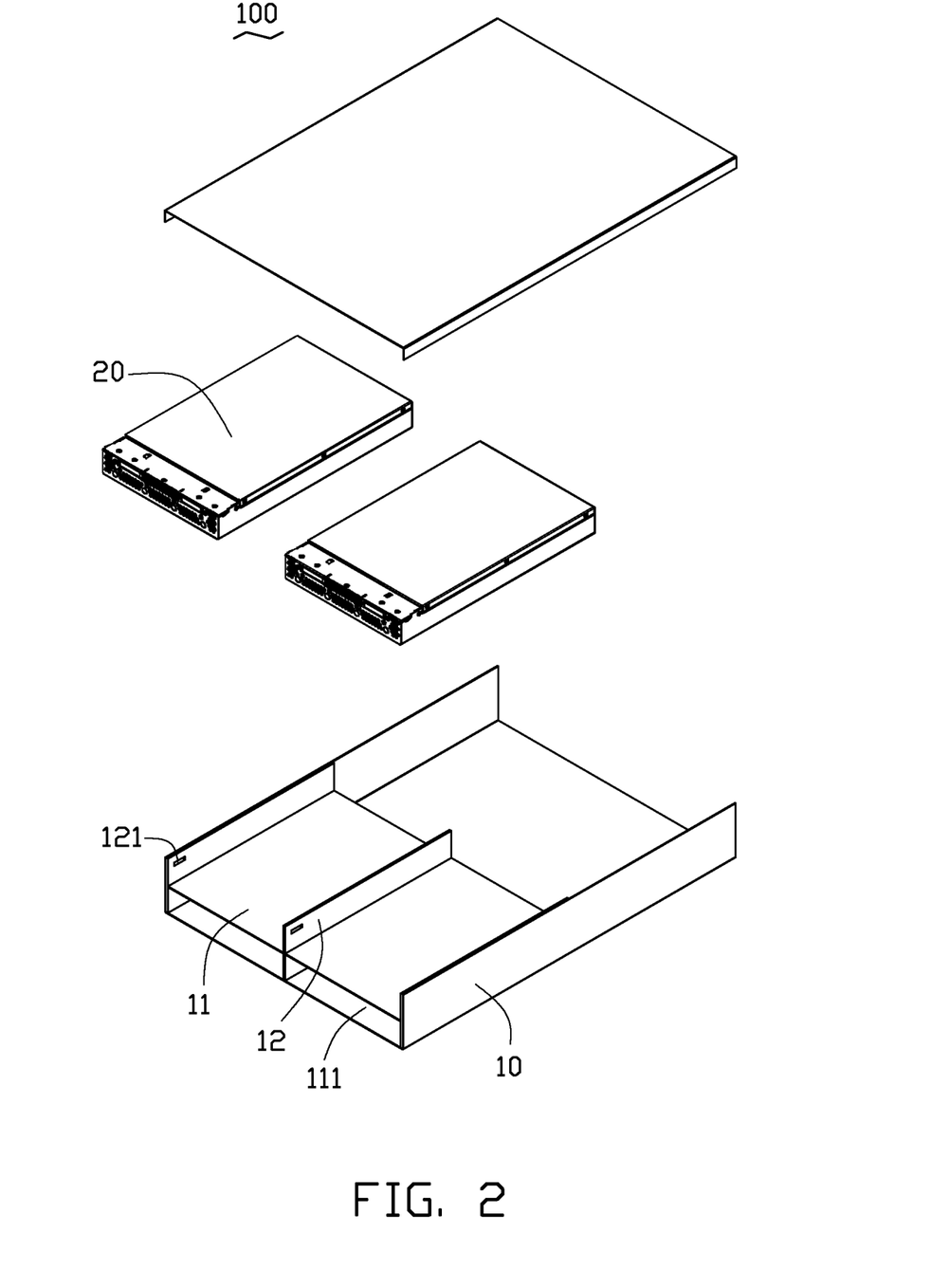
FIG. 2 is a schematic, exploded view of the electronic device of FIG. 1.

Referring to FIGS. 1 and 2, an electronic device 100 according to an exemplary embodiment is shown. The electronic device 100 includes a housing 10 and a number of mounting apparatuses 20.

The housing 10 defines a number of receiving spaces 11 corresponding to the mounting apparatuses 20. Each receiving space 11 can be used for receiving a mounting apparatus 20, and is bounded between two opposite sidewalls 12. Each receiving space 11 defines an opening 111, and has two opposite sidewalls 12. The mounting apparatus 20 can be inserted into the receiving space 11 through the opening 111. Each sidewall 12 defines a first latching hole 121 at an end of the sidewall 12 adjacent to the opening 111.

Figure 3:
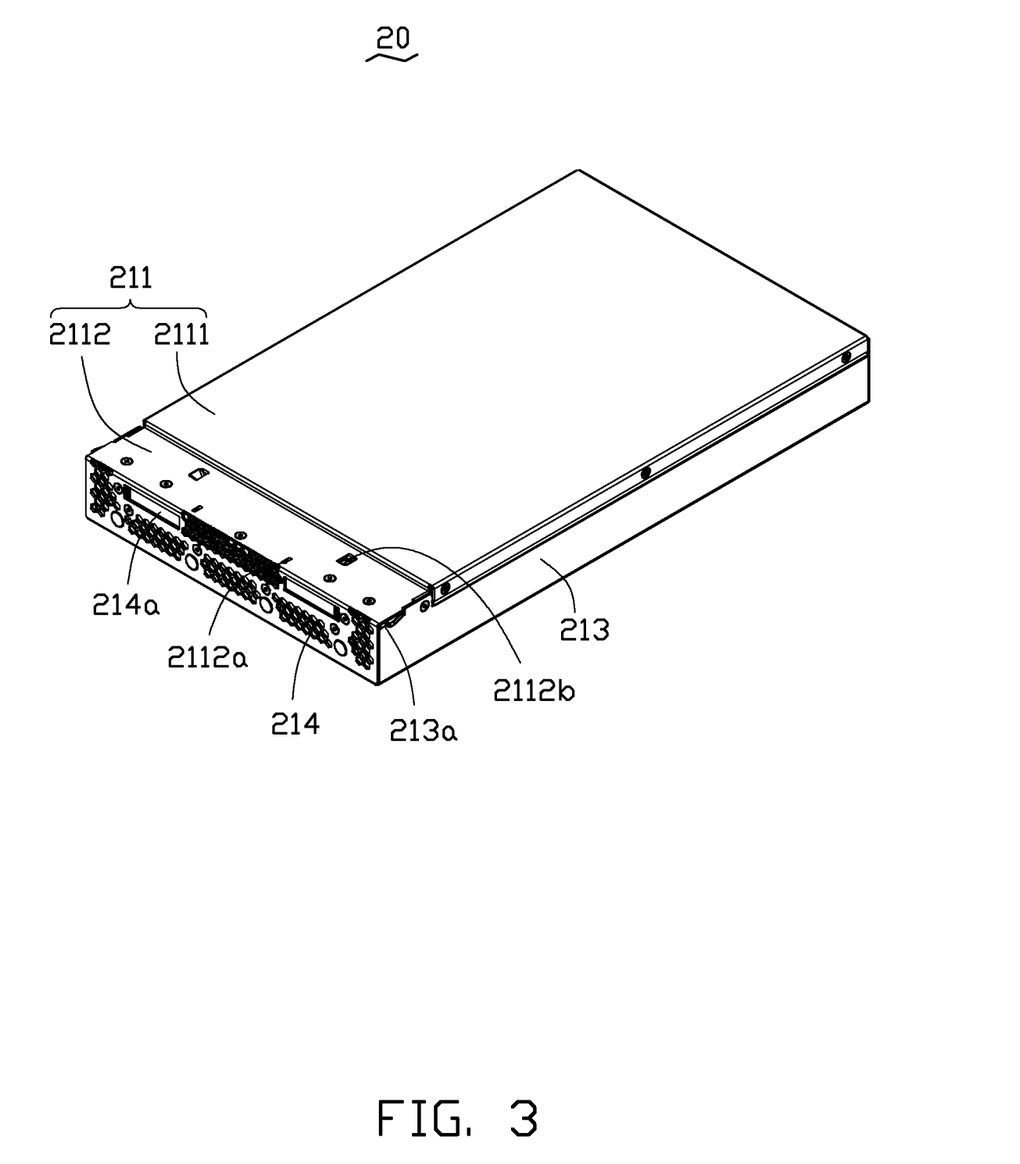
FIG. 3 is a schematic view of a mounting apparatus of the electronic device of FIG. 1.
Figure 4:
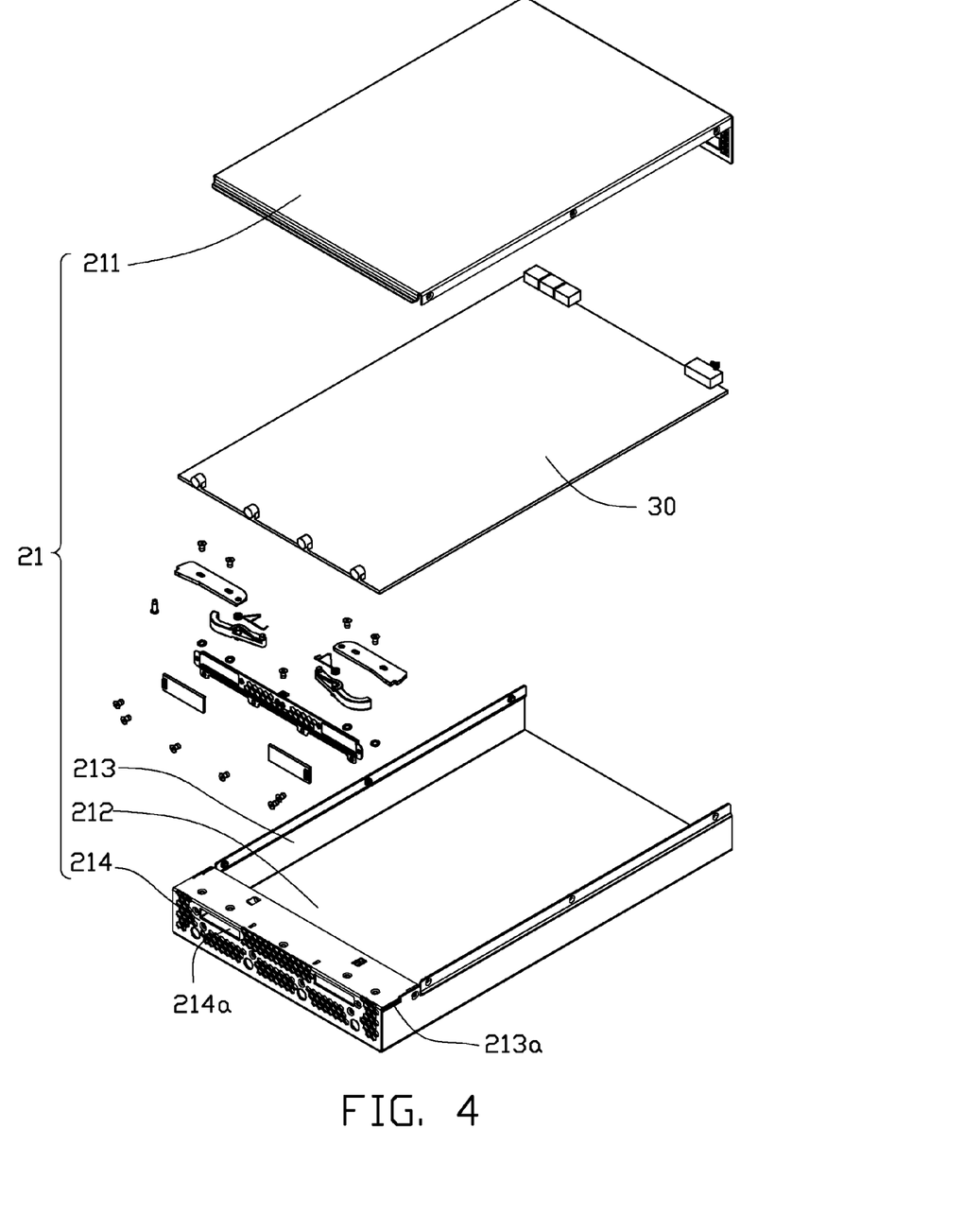
FIG. 4 is a schematic, exploded view of the mounting apparatus of FIG. 3.
Figure 5:
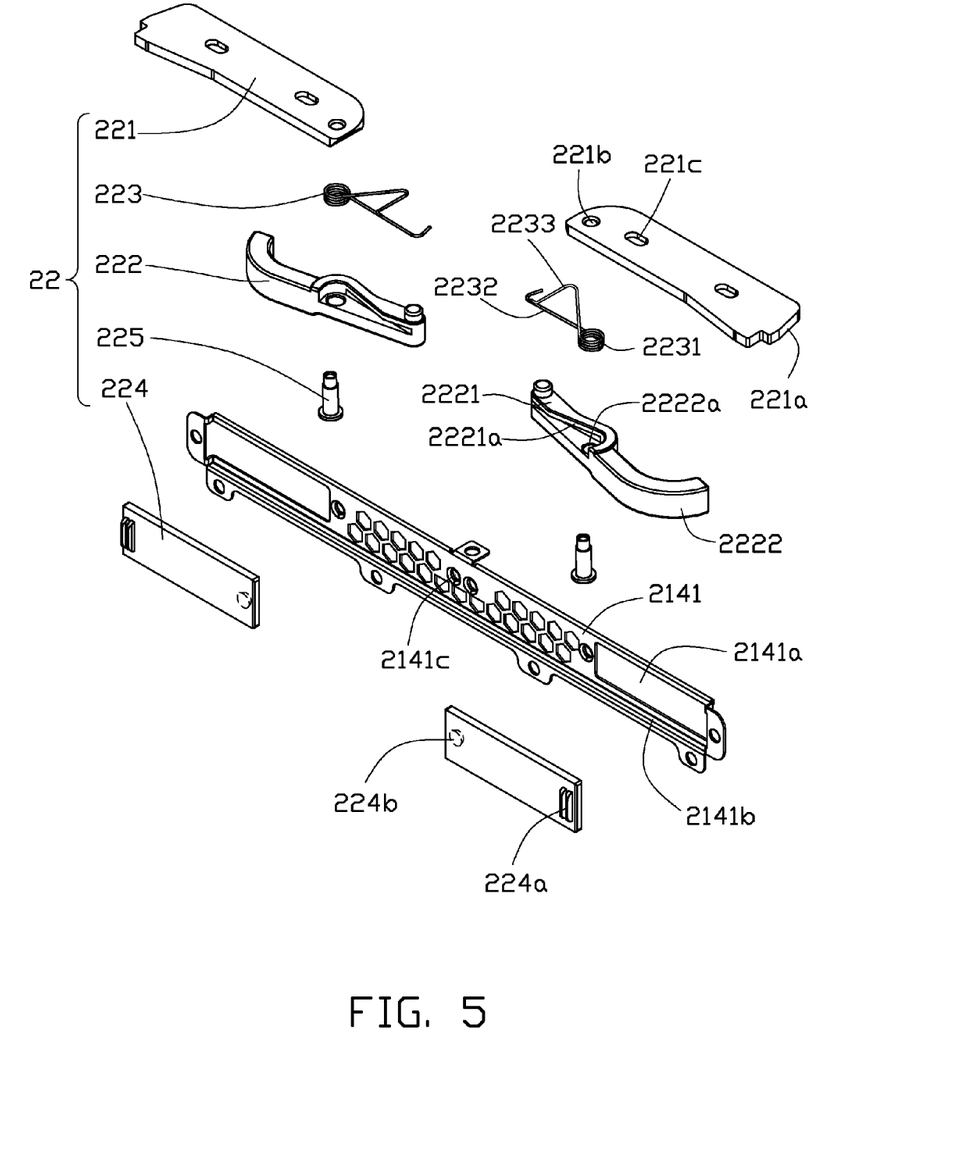
FIG. 5 is a schematic, exploded view of operating assemblies of the mounting apparatus of FIG. 4.

Further referring to FIGS. 3 to 5, the mounting apparatuses 20 is configured for fixing an accessory 30 relative to the housing 10. The accessory 30 can be a circuit board, a storage module and so on. In the present embodiment, the accessory 30 is a circuit board. The mounting apparatus 20 includes a casing 21 and two operating assemblies 22.

The casing 21 is configured for receiving the accessory 30. The casing 21 includes a top wall 211, a bottom wall 212 opposite to the top wall 211, two opposite lateral walls 213, and a front wall 214. In the present embodiment, the accessory 30 is fixed to an inner surface of the bottom wall 212.

Each of the two opposite lateral walls 213 connects between the top wall 211 and the bottom wall 212, the two opposite lateral walls 213 faces towards the two sidewalls 12 respectively. Each lateral wall 213 defines a second latching hole 213a corresponding to the first latching hole 121 of the sidewall 12. In the illustrated embodiment, the second latching hole 213a is a cutout. In other embodiments, the second latching hole 213a can also be a through hole.

The front wall 214 faces the opening 111 of the receiving space 11, and connects to the two opposite lateral walls 213, the top wall 211, and the bottom wall 212. The front wall 214 defines two first slots 214a adjacent to the two lateral walls 213 respectively. The front wall 214 further includes a supporting plate 2141 fixed to the inner surface of the front wall 214. The supporting plate 2141 defines two second slots 2141a corresponding to the first slots 214a. The supporting plate 2141 further defines a sliding rail 2141b. In the present embodiment, the supporting plate 2141 is fixed to the front wall 214 by screws (not labeled). In other embodiments, the supporting plate 2141 can also be integrally formed with the front wall 214.

The top wall 211 includes a main body 2111 and a front end portion 2112 adjacent to the front wall 214. The front end portion 2112 includes two fixing protrusions 2112a and two limiting protrusions 2112b on the inner surface thereof. Each first slot 214a corresponds to and is adjacent to a corresponding fixing protrusion 2112a and a corresponding limiting protrusion 211b.

The two operating assemblies 22 are configured for latching with the two sidewalls 12 of each receiving space 11 respectively. In the present embodiment, the two operating assemblies 22 have the same structure. Each operating assembly 22 includes a latching plate 221, a handle 222, a torsion spring 223, an operating plate 224, and a rotating shaft 225.

The latching plate 221 is slidably connected to the inner surface of the front end portion 2112 of the top wall 211. The latching plate 221 is configured for latching with one sidewall 12 of the housing 10. The latching plate 221 includes a first end adjacent to the corresponding sidewall 12, and a second end opposite to the first end. The latching plate 221 has a latching protrusion 221a at the first end thereof. The latching protrusion 221a can be inserted in to the first latching hole 121 of the sidewall 12 when the latching plate 221 slides towards the sidewall 12. The latching plate 221 further defines a connecting hole 221b at the second end thereof. In the present embodiment, each latching plate 221 defines two sliding slot 221c between the connecting hole 221b and the latching protrusion 221a. The latching plate 221 is connected to the front end portion 2112 by two screws (not labeled) passing through the two sliding slots 221c respectively. Each latching plate 221c can move towards or away from the cutout 213a.

The handle 222 defines a shaft hole 2222a at the center thereof. The handle 222 includes a first portion 2221 and a second portion 2222. The first portion 2221 and the second portion 2222 are located at two opposite sides of the shaft hole 2222a. The first portion 2221 includes a resisting surface 2221a.

Each torsion spring 223 includes a coil portion 2231, a first leg 2232, and a second leg 2233. The handle 222 and the torsion spring 223 are connected to the latching plates 221 by the rotating shaft 225 running through the shaft hole 2222a of the handle 222, the coil portion 2231 of the torsion spring 223, and the connecting hole 221b in sequence. The first leg 2232 resists the resisting surface 2221a of the first portion 2221 of the handle 222. The first leg 2232 includes a hook at the free end thereof to hook the distal end of the first portion 2221, thus, the first leg 2232 can be fixed to the first portion 2221 of the handle 222. The second leg 2233 is fixed to the fixing protrusion 2112a of the front end portion 2112 of the top wall 211. The fixing protrusion 2112a is located between the first portion 2221 and the front wall 214, and at a side of the rotating shaft 225 away from the corresponding sidewall 12. In the present embodiment, the second leg 2233 is curved, thus, the distance between the rotating shaft 225 and the fixing protrusion 2112a can be decreased by compressing the second leg 2233.

The operating plate 224 is slidably secured on the sliding rail 2141b of the supporting plate 2141, that is the operating plates 224 being slidably connected to the front wall 214, because the supporting plate 2141 is fixed to the front wall 214. In other embodiments, the supporting plate 2141 can be omitted, and the operating plate 224 can be slidably connected to the front wall 214 directly. The operating plates 224 are slidable along the sliding rail 2141b of the supporting plate 2141. The operating plate 224 can slide towards the first slot 214a to cover the first slot 214a, or slide away from the first slot 214a to expose the first slot 214a. The operating plate 224 includes an operating protrusion 224a on an outer surface thereof, thus, users can slide the operating plate 224 conveniently. The operating plate 224 further defines a positioning protrusion 224b on an inner surface thereof for engaging with positioning holes 2141c defined on the supporting plate 2141.

Figure 6:
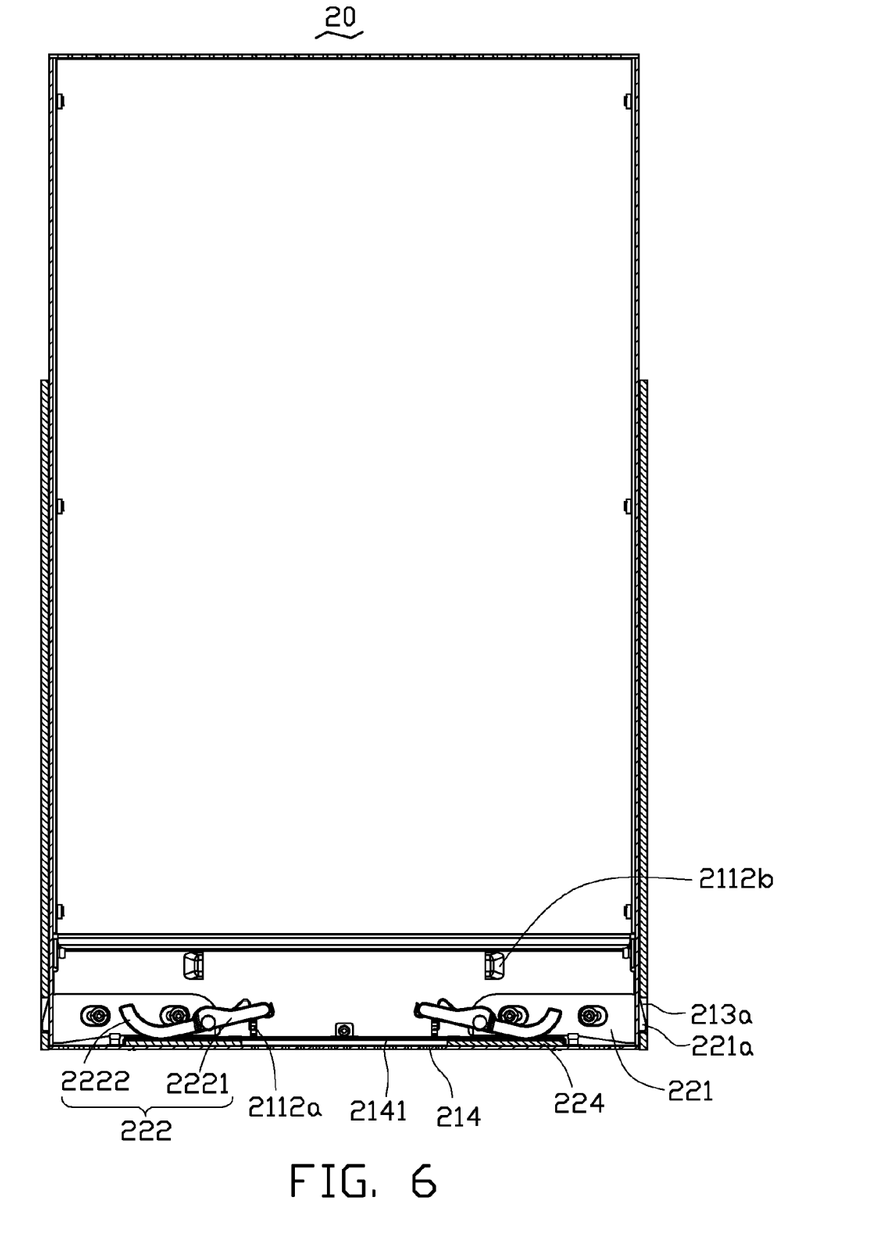
FIG. 6 is a top plan view of the mounting apparatus of FIG. 3 secured inside the electronic device of FIG. 1, supposing that a top wall of the mounting apparatus and the supporting plate are transparent.

Referring to FIG. 6, when the mounting apparatus 20 is received in the receiving space 11 of the housing 10, the latching protrusion 221a of the latching plate 221 is running through the cutout 213a to latch with the first latching hole 121 of the sidewall 12 to fix the mounting apparatus 20 to the housing 10. The operating plate 224 covers the first slot 214a of the front wall 214. The second portion 2222 of each handle 222 passes through the first and second slots 214a, 2141a and resists the operating plate 224. The torsion spring 223 is compressed with the first leg 2232 resisting the resisting surface 2221a of the first portion 2221 of the handle, and the second leg 2233 resisting the fixing protrusion 2112a of the front end portion 2112 of the top wall 211. As a result, the torsion spring 223 provides an elastic force to push the first portion 2221 such that the second portion 2222 resists the operating plate 224.

Figure 7:
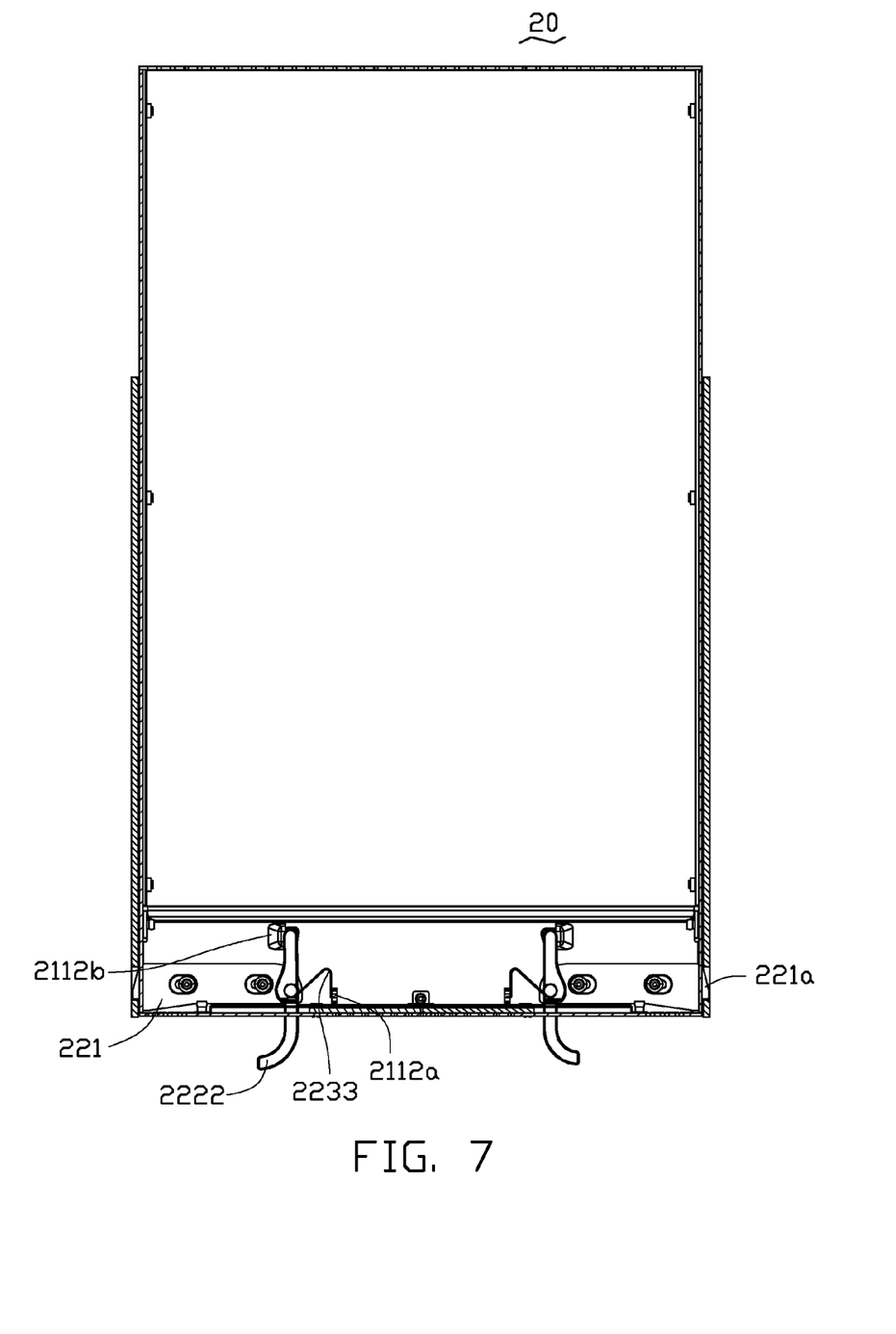
FIGS. 7 and 8 are another two states of the mounting apparatus of FIG. 6.

Referring to FIG. 7, when the operating plate 224 slide away from the slot first 214a to expose the first slot 214a, the second portion 2222 of the handle 222 can extend out of the casing 21 through the first and second slots 214a, 2141a by the elastic force of the torsion spring 223. The rotation angle of the handle 222 can be limited by the limiting protrusion 2112b stopping the first portion 2221.

Figure 8:
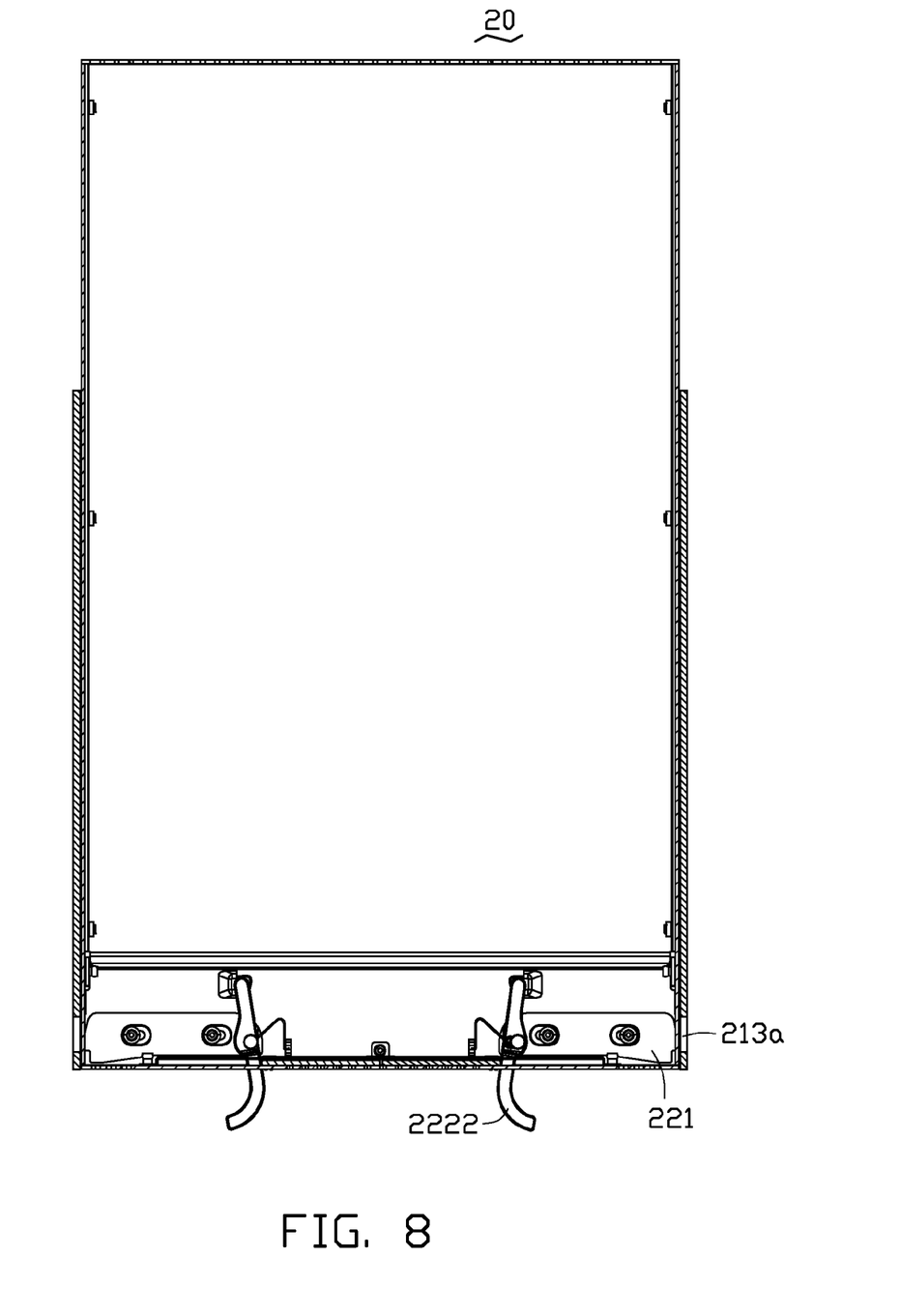

Referring to FIG. 8, after the second portion 2222 extending out of the casing 21, the second portion 2222 and the latching plate 221 can be moved away from the corresponding sidewall 12, thus, the latching protrusion 221a of the latching plate 221 will be moved out of the first latching hole 121 of the sidewall 12 and the cutout 213a, and accordingly, the mounting apparatus 20 can be taken out of the housing 10. When the latching plate 221 is moved away from the sidewall 12, the second leg 2233 will be compressed. The compressed second leg 2233 can be convenient for the latching plate 221 latching with the sidewall 12 during assembling the mounting apparatus 20.

It is understood, in other embodiments, the latching plate 221 can also be connected to the bottom wall 212 instead of the top wall 211, accordingly, the limiting protrusion 2112b and the fixing protrusion 2112a can be disposed on the bottom wall 212. In other embodiments, the torsion spring 223 can also be instead of other elastic member which can provide the elastic force to rotate the handle 222.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope and spirit of the appended claims.

What is claimed is:

1. An electronic device comprising:
    a housing defining at least one receiving space, each receiving space having an opening; and
    at least one mounting apparatus, each mounting apparatus received in a respective one of the at least one receiving space, each mounting apparatus being configured for fixing an accessory, and being capable of being taken out of the respective receiving space through the opening, each mounting apparatus comprising:
    a casing comprising a front wall facing the opening, the front wall defining a slot; and
    an operating assembly comprising:
        a handle received in and pivotably connected to the casing;
        an elastic member resisting against the handle for providing an elastic force to rotate the handle to make a portion of the handle extend out of the casing through the slot; and
        an operating plate slidably connected to the front wall, the operating plate being capable of covering the slot to limit the portion of the handle from extending out of the casing through the slot and uncovering the slot to allow the portion of the handle to extend out of the casing through the slot.

2. The electronic device as claimed in claim 1, wherein the front wall further comprises a supporting plate, the supporting plate is fixed to an inner surface of the front wall and comprises a sliding rail, and the operating plate is slidably secured on the sliding rail.

3. The electronic device as claimed in claim 2, wherein the operating plate comprises a positioning protrusion thereon, and the supporting plate has a plurality of positioning holes for receiving the positioning protrusion.

4. The electronic device as claimed in claim 1, wherein the operating plate comprises an operating protrusion on an outer surface thereof.

5. The electronic device as claimed in claim 1, wherein the operating assembly further comprises a rotating shaft, the handle defines a shaft hole at the center thereof, the rotating shaft passes through the shaft hole, the handle comprises a first portion and a second portion located at two opposite sides of the shaft hole, the first portion engages with the elastic member, and the second portion is configured for extending out of the casing.

6. The electronic device as claimed in claim 5, wherein the elastic member is a torsion spring, and the torsion spring comprises a first leg fixed to the first portion of the handle and a second leg fixed to the casing.

7. The electronic device as claimed in claim 6, wherein the casing further comprises a top wall with a front end portion, the front end portion comprises a fixing protrusion adjacent to the slot, and the second leg of the torsion spring is fixed to the fixing protrusion.

8. The electronic device as claimed in claim 7, wherein the front end portion further comprises a limiting protrusion for limiting the first portion of the handle when the second portion extends out of the casing through the slot.

9. The electronic device as claimed in claim 7, wherein the housing has a side wall at a side of the receiving space, the sidewall defines a latching hole thereon, the operating assembly further comprises a latching plate with a latching protrusion at an end of the latching plate facing towards the sidewall, and the latching plate is positioned on the front end portion and capable of moving towards or away from the sidewall.

10. The electronic device as claimed in claim 9, wherein the torsion spring comprises a coil portion connected between the first and second legs, the rotating shaft passes through the shaft hole and the coil portion, and one end of the rotating shaft is positioned on the latching plate.

11. The electronic device as claimed in claim 10, wherein the fixing protrusion of the front end portion is located at a side of the rotating shaft away from the sidewall, and the second leg of the torsion spring is compressed when the latching plate moves away from the sidewall.

12. An electronic device comprising:
a housing defining at least one receiving space, each receiving space defined between two opposite sidewalls and having an opening, each sidewall defining a first latching hole; and
at least one mounting apparatus, each mounting apparatus received in a respective one of the at least one receiving space, the mounting apparatus being configured for fixing an accessory, and being capable of being taken out of the respective receiving space through the opening, each mounting apparatus comprising:
a casing comprising a front wall facing the opening, and two opposite lateral walls connected to two opposite ends of the front wall, the front wall defining two slots, each lateral wall facing a respective one of the sidewalls and defining a second latching hole aligned with the first latching hole of the respective sidewall; and
two operating assemblies, each operating assembly comprising a latching plate, a handle, an operating plate and an elastic member, the latching plate received in and slidably secured on the casing and comprising a latching protrusion, the latching protrusion capable of sliding into or out of a respective second latching hole and a respective first latching hole, the handle received in and rotatably connected to the latching plate, a portion of the handle being capable of extending out of the casing through a respective one of the two slots by rotating the handle, the elastic member compressed between the handle and the casing and configured for providing an elastic force to rotate the handle to make the portion of the handle extend out of the casing, the operating plate slidably connected to the front wall, the operating plate being capable of covering a respective one of the slots to limit the portion of the handle from extending out of the casing through the respective slot and uncovering the respective slot to allow the portion of the handle to extend out of the casing through the respective slot.

13. The electronic device as claimed in claim 12, wherein each operating assembly further comprises a rotating shaft, the handle defines a shaft hole at the center thereof, the rotating shaft passes through the shaft hole, one end of the rotating shaft is secured on the latching plate, the handle comprises a first portion and a second portion located at two opposite sides of the shaft hole, the first portion engages with the elastic member, and the second portion is configured for extending out of the casing.

14. The electronic device as claimed in claim 13, wherein the elastic member is a torsion spring, the torsion spring comprises a coil portion, a first leg and a second leg, the coil portion is connected between the first and second legs, the first leg is fixed to the first portion of the handle, the second leg is fixed to the casing, and the rotating shaft passes through the coil portion.

15. The electronic device as claimed in claim 14, wherein the casing further comprises a top wall with a front end portion, the latching plate is slidably secured on the front end portion, the front end portion comprises two fixing protrusions, each fixing protrusion is adjacent to a respective one of the slots, and the second leg of each torsion spring is fixed to a respective fixing protrusion.

16. The electronic device as claimed in claim 15, wherein the front end portion further comprises two limiting protrusions, and each limiting protrusion is configured for limiting the first portion of a respective handle when the second portion of the respective handle extends out of the casing through the respective slot.

17. The electronic device as claimed in claim 15, wherein each fixing protrusion is located at a side of a respective rotating shaft away from a respective sidewall, and the second leg of each torsion spring is compressed when a respective latching plate moves away from the respective sidewall.

18. The electronic device as claimed in claim 12, wherein the second latching hole is a cutout or a through hole.

* * * * *